(12) United States Patent
Newman et al.

(10) Patent No.: US 9,705,494 B2
(45) Date of Patent: Jul. 11, 2017

(54) VEHICLE ASSEMBLIES HAVING FASCIA PANELS WITH CAPACITANCE SENSORS OPERATIVE FOR DETECTING PROXIMAL OBJECTS

(75) Inventors: Todd R. Newman, Traverse City, MI (US); John M. Washeleski, Cadillac, MI (US)

(73) Assignee: UUSI, LLC, Reed City, MI (US)

( * ) Notice: Subject to any disclaimer, the term of this patent is extended or adjusted under 35 U.S.C. 154(b) by 1416 days.

(21) Appl. No.: 12/545,178

(22) Filed: Aug. 21, 2009

(65) Prior Publication Data

US 2011/0041409 A1 Feb. 24, 2011

(51) Int. Cl.
*H03K 17/955* (2006.01)
*H03K 17/96* (2006.01)
*E05F 15/46* (2015.01)

(52) U.S. Cl.
CPC ........... *H03K 17/955* (2013.01); *E05F 15/46* (2015.01); *H03K 17/962* (2013.01); *E05Y 2900/546* (2013.01)

(58) Field of Classification Search
USPC ............... 49/26, 27, 28; 70/780; 296/50, 56, 296/146.4, 146.7, 155, 190.03, 190.11; 318/466
See application file for complete search history.

(56) References Cited

U.S. PATENT DOCUMENTS

| | | | | |
|---|---|---|---|---|
| 2,476,111 A | * | 7/1949 | Opalek | 49/27 |
| 3,830,018 A | * | 8/1974 | Arai et al. | 49/28 |
| 3,855,733 A | * | 12/1974 | Miller | 49/489.1 |
| 4,178,621 A | | 12/1979 | Simonelic et al. | |

(Continued)

FOREIGN PATENT DOCUMENTS

| CN | 201158356 Y | 12/2003 |
|---|---|---|
| DE | 10 2006 009 998 A1 | 9/2007 |

(Continued)

OTHER PUBLICATIONS

International Searching Authority, International Search Report and the Written Opinion for PCT/US2010/045729 mailed Oct. 6, 2010.

(Continued)

*Primary Examiner* — Dennis H Pedder
*Assistant Examiner* — Paul Chenevert
(74) *Attorney, Agent, or Firm* — Howard & Howard Attorneys PLLC

(57) ABSTRACT

A vehicle assembly includes an electrically non-conductive fascia panel and an electrical conductor mounted to the fascia panel. The conductor capacitively couples to an electrically conductive object proximal to the fascia panel while the conductor is driven with an electrical charge such that capacitance of the conductor changes due to the conductor capacitively coupling with the object. The assembly may further include a controller operable for driving the conductor with the electrical charge and for measuring the capacitance of the conductor to determine whether an electrically conductive object is proximal to the fascia panel. The controller controls a vehicle function such as movement of a movable panel like a lift gate associated with the fascia panel depending on whether an electrically conductive object is proximal to the fascia panel.

14 Claims, 4 Drawing Sheets

(56) References Cited

U.S. PATENT DOCUMENTS

| | | | |
|---|---|---|---|
| 4,410,843 A | 10/1983 | Sauer et al. | |
| 4,422,521 A * | 12/1983 | Mochida | 180/271 |
| 4,933,807 A | 6/1990 | Duncan | |
| 5,361,018 A | 11/1994 | Milton | |
| 5,394,292 A | 2/1995 | Hayashida | |
| 5,493,277 A | 2/1996 | Pierce et al. | |
| 5,621,290 A | 4/1997 | Heller et al. | |
| 5,730,165 A | 3/1998 | Philipp | |
| 5,801,340 A | 9/1998 | Peter | |
| 5,952,801 A | 9/1999 | Boisvert et al. | |
| 5,959,538 A | 9/1999 | Schousek | |
| 6,185,872 B1 | 2/2001 | Seeberger et al. | |
| 6,188,228 B1 | 2/2001 | Philipp | |
| 6,233,872 B1 | 5/2001 | Glagow et al. | |
| 6,337,549 B1 | 1/2002 | Bledin | |
| 6,340,199 B1 * | 1/2002 | Fukumoto et al. | 296/155 |
| 6,377,009 B1 | 4/2002 | Philipp | |
| 6,389,752 B1 | 5/2002 | Rosenau | |
| 6,404,158 B1 | 6/2002 | Boisvert et al. | |
| 6,431,638 B1 * | 8/2002 | Mrozowski et al. | 296/146.8 |
| 6,498,214 B2 * | 12/2002 | Laughner et al. | 525/191 |
| 6,499,359 B1 | 12/2002 | Washeleski et al. | |
| 6,555,982 B2 | 4/2003 | Tyckowski | |
| 6,700,393 B2 | 3/2004 | Haag et al. | |
| 6,723,933 B2 | 4/2004 | Haag et al. | |
| 6,782,759 B2 | 8/2004 | Shank et al. | |
| 6,879,250 B2 | 4/2005 | Fayt et al. | |
| 6,933,831 B2 | 8/2005 | Ieda et al. | |
| 6,936,986 B2 | 8/2005 | Nuber | |
| 6,946,853 B2 | 9/2005 | Gifford et al. | |
| 6,968,746 B2 | 11/2005 | Shank et al. | |
| 6,980,095 B2 | 12/2005 | Wright et al. | |
| 7,015,666 B2 | 3/2006 | Staus | |
| 7,038,414 B2 | 5/2006 | Daniels et al. | |
| 7,055,885 B2 * | 6/2006 | Ishihara et al. | 296/146.4 |
| 7,084,859 B1 | 8/2006 | Pryor | |
| 7,116,117 B2 | 10/2006 | Nakano et al. | |
| 7,126,453 B2 | 10/2006 | Sandau et al. | |
| 7,132,642 B2 | 11/2006 | Shank et al. | |
| 7,152,907 B2 * | 12/2006 | Salhoff et al. | 296/146.7 |
| 7,162,928 B2 | 1/2007 | Shank et al. | |
| 7,219,945 B1 * | 5/2007 | Zinn et al. | 296/56 |
| 7,248,151 B2 | 7/2007 | McCall | |
| 7,255,466 B2 | 8/2007 | Schmidt et al. | |
| 7,260,454 B2 | 8/2007 | Pickering et al. | |
| 7,293,467 B2 | 11/2007 | Shank et al. | |
| 7,312,591 B2 | 12/2007 | Washeleski et al. | |
| 7,333,090 B2 | 2/2008 | Tanaka et al. | |
| 7,342,373 B2 | 3/2008 | Newman et al. | |
| 7,354,097 B2 * | 4/2008 | Jackson et al. | 296/146.1 |
| 7,375,299 B1 | 5/2008 | Pudney | |
| 7,424,347 B2 | 9/2008 | Babala et al. | |
| 7,424,377 B2 | 9/2008 | Hamilton et al. | |
| 7,449,852 B2 | 11/2008 | Washeleski et al. | |
| 7,513,166 B2 | 4/2009 | Shank et al. | |
| 7,518,327 B2 | 4/2009 | Newman et al. | |
| 7,525,062 B2 | 4/2009 | Adam et al. | |
| 7,538,672 B2 | 5/2009 | Lockyer et al. | |
| 7,547,058 B2 | 6/2009 | King et al. | |
| 7,548,809 B2 | 6/2009 | Westerhoff | |
| 7,576,631 B1 | 8/2009 | Bingle et al. | |
| 7,706,046 B2 | 4/2010 | Bauer et al. | |
| 7,710,245 B2 | 5/2010 | Pickering | |
| 7,733,332 B2 | 6/2010 | Steenwyk et al. | |
| 7,812,721 B2 * | 10/2010 | Hoshina et al. | 340/540 |
| 7,893,831 B2 * | 2/2011 | Hoshina et al. | 49/26 |
| 7,976,749 B2 * | 7/2011 | Volkel et al. | 264/45.6 |
| 7,989,725 B2 | 8/2011 | Boddie et al. | |
| 8,033,052 B2 * | 10/2011 | Kraus et al. | 49/28 |
| 8,154,418 B2 | 4/2012 | Peterson et al. | |
| 8,321,174 B1 | 11/2012 | Moyal et al. | |
| 8,589,033 B2 * | 11/2013 | Rafii | G06T 7/2053 318/286 |
| 8,635,809 B2 * | 1/2014 | Wuerstlein | E05F 15/46 296/146.9 |
| 8,874,324 B2 * | 10/2014 | Eggers | B60R 13/07 296/146.4 |
| 9,051,769 B2 | 6/2015 | Washeleski et al. | |
| 9,199,608 B2 | 12/2015 | Newman et al. | |
| 2001/0026244 A1 | 10/2001 | Ieda et al. | |
| 2001/0052839 A1 | 12/2001 | Nahata et al. | |
| 2002/0125994 A1 | 9/2002 | Sandau et al. | |
| 2003/0071727 A1 | 4/2003 | Haag et al. | |
| 2003/0216817 A1 | 11/2003 | Pudney | |
| 2004/0124662 A1 * | 7/2004 | Cleland et al. | 296/146.4 |
| 2004/0140045 A1 * | 7/2004 | Burgess et al. | 156/182 |
| 2004/0233677 A1 | 11/2004 | Su et al. | |
| 2005/0073852 A1 * | 4/2005 | Ward | 362/501 |
| 2005/0090946 A1 | 4/2005 | Pickering et al. | |
| 2005/0092097 A1 | 5/2005 | Shank et al. | |
| 2005/0187689 A1 | 8/2005 | Westerhoff | |
| 2006/0026521 A1 | 2/2006 | Hotelling et al. | |
| 2006/0145825 A1 | 7/2006 | McCall | |
| 2006/0177212 A1 | 8/2006 | Lamborghini et al. | |
| 2007/0089527 A1 | 4/2007 | Shank et al. | |
| 2007/0096904 A1 | 5/2007 | Lockyer et al. | |
| 2007/0152615 A1 | 7/2007 | Newman et al. | |
| 2007/0171057 A1 | 7/2007 | Ogino et al. | |
| 2007/0195542 A1 | 8/2007 | Metros et al. | |
| 2007/0276550 A1 | 11/2007 | Desai et al. | |
| 2007/0296242 A1 * | 12/2007 | Frommer et al. | 296/146.4 |
| 2008/0024451 A1 | 1/2008 | Aimi et al. | |
| 2008/0142593 A1 | 6/2008 | Walsh et al. | |
| 2008/0202912 A1 | 8/2008 | Boddie et al. | |
| 2009/0000196 A1 * | 1/2009 | Kollar et al. | 49/28 |
| 2009/0044449 A1 * | 2/2009 | Appel et al. | 49/28 |
| 2009/0219134 A1 | 9/2009 | Nakasato et al. | |
| 2009/0243824 A1 | 10/2009 | Peterson et al. | |
| 2010/0024301 A1 * | 2/2010 | Wuerstlein et al. | 49/28 |
| 2010/0079387 A1 | 4/2010 | Rosenblatt et al. | |
| 2010/0096193 A1 | 4/2010 | Yilmaz et al. | |
| 2010/0097469 A1 | 4/2010 | Blank et al. | |
| 2010/0219935 A1 | 9/2010 | Bingle et al. | |
| 2010/0287837 A1 * | 11/2010 | Wuerstlein et al. | 49/26 |
| 2011/0001550 A1 | 1/2011 | Schoen | |
| 2011/0041409 A1 | 2/2011 | Newman et al. | |
| 2011/0043325 A1 * | 2/2011 | Newman et al. | 340/5.2 |
| 2011/0057773 A1 * | 3/2011 | Newman et al. | 340/5.72 |
| 2011/0187492 A1 * | 8/2011 | Newman et al. | 340/5.2 |
| 2011/0313619 A1 * | 12/2011 | Washeleski et al. | 701/36 |
| 2011/0316304 A1 | 12/2011 | Schwaiger et al. | |
| 2012/0182141 A1 | 7/2012 | Peterson et al. | |
| 2012/0192489 A1 * | 8/2012 | Pribisic | 49/28 |
| 2012/0219935 A1 | 8/2012 | Stebbings et al. | |
| 2015/0267453 A1 * | 9/2015 | Matsumoto | E05F 15/42 49/27 |

FOREIGN PATENT DOCUMENTS

| | | | | |
|---|---|---|---|---|
| EP | 1 991 751 | A1 | 11/2008 | |
| FR | EP 1247696 | A1 * | 10/2002 | B60R 13/04 |
| WO | 8908952 | A1 | 9/1989 | |
| WO | WO 8908952 | A1 * | 9/1989 | H03K 17/975 |
| WO | 0212669 | | 2/2002 | |
| WO | 03038220 | | 5/2003 | |
| WO | 2007/098746 | A1 | 9/2007 | |

OTHER PUBLICATIONS

International Preliminary Examining Authority, International Preliminary Report on Patentability for the corresponding PCT Application No. PCT/US2010/45729 mailed Jan. 20, 2012.

Non-Final Office Action mailed Jun. 17, 2016 for Utility U.S. Appl. No. 13/221,167.

Non-Final Office Action for Utility U.S. Appl. No. 14/730,420 mailed Aug. 9, 2016.

Machine-assisted English language abstract for DE 10 2006 009 998 extracted from espacenet.com database on May 12, 2016, 3 pages.

English language abstract for WO 2007/098746 extracted from espacenet.com database on May 12, 2016, 1 page.

(56) References Cited

OTHER PUBLICATIONS

English language abstract not found for EP 1 991 751; however, see US 2009/0044449 English language equivalent of corresponding WO 2007/098746.
International Preliminary Report on Patentability for Application No. PCT/US11/58523 dated Feb. 1, 2013, 17 pages.
English language abstract and machine-assisted English translation for CN 201158356 extracted from espacenet.com database on May 12, 2016, 8 pages.
Non-Final Office Action mailed Oct. 18, 2016 for Utility U.S. Appl. No. 12/784,010.
Notice of Allowance and Fees Due mailed Oct. 27, 2016 for Utility U.S. Appl. No. 13/084,611.
Final Office Action mailed Nov. 29, 2016 for Utility U.S. Appl. No. 14/730,420.
Final Office Action mailed Nov. 30, 2016 for Utility U.S. Appl. No. 13/221,167.

\* cited by examiner

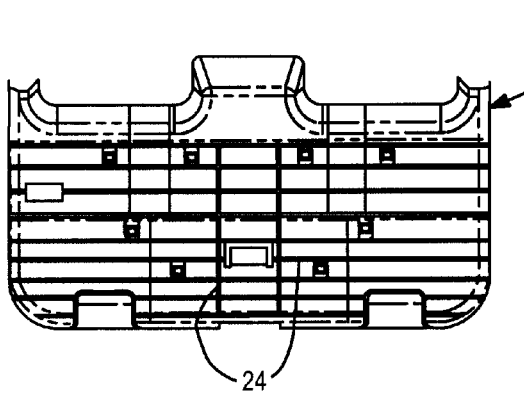
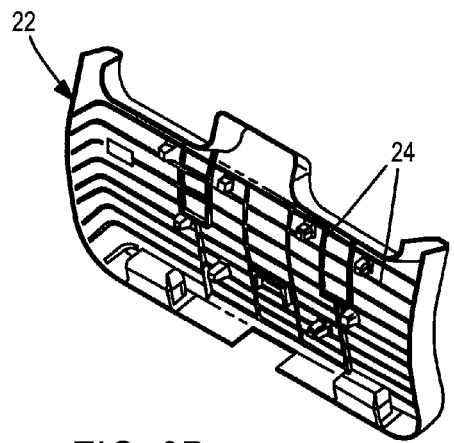
FIG. 3A  FIG. 3B
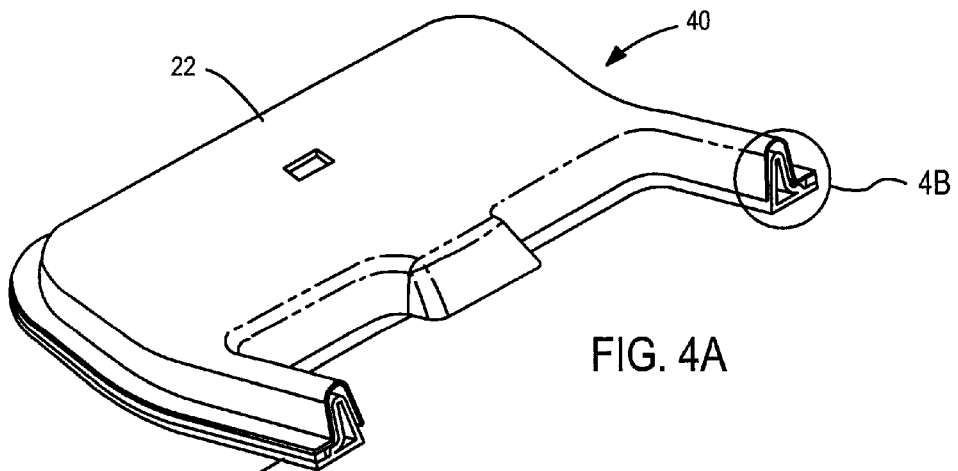
FIG. 4A
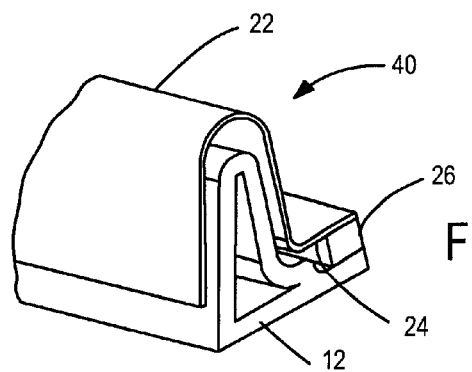
FIG. 4B

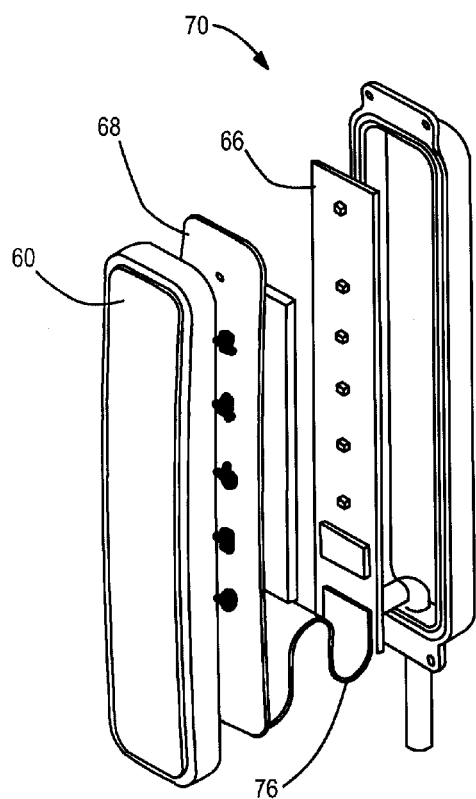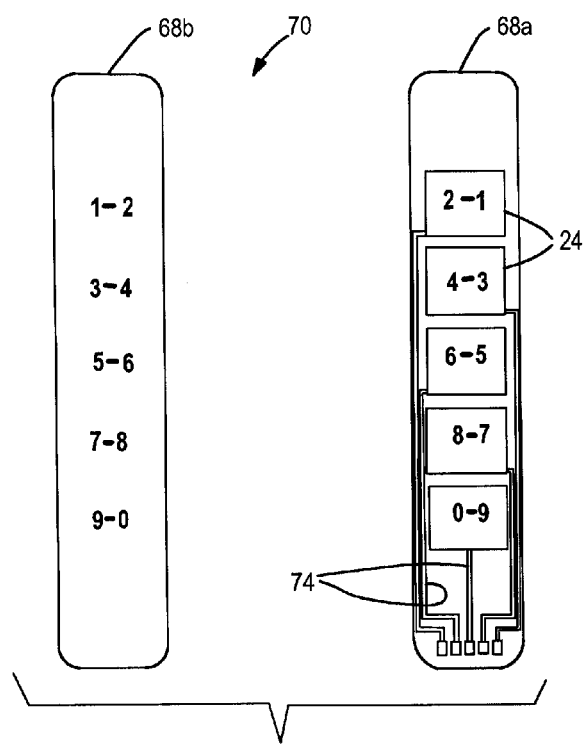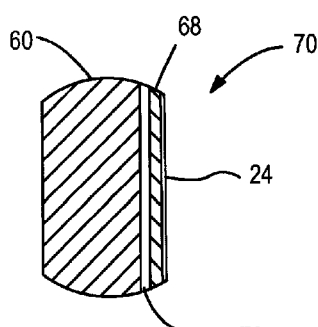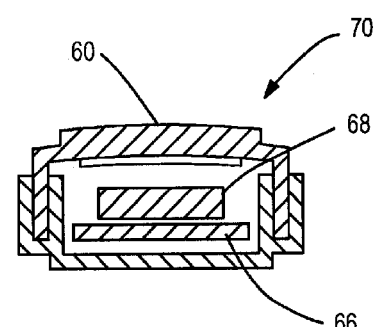
FIG. 7A
FIG. 7B
FIG. 7C
FIG. 7D

VEHICLE ASSEMBLIES HAVING FASCIA PANELS WITH CAPACITANCE SENSORS OPERATIVE FOR DETECTING PROXIMAL OBJECTS

BACKGROUND OF THE INVENTION

Field of the Invention

The present invention relates to vehicle assemblies having fascia panels.

SUMMARY OF THE INVENTION

An object of the present invention is to provide a vehicle assembly having a fascia panel with a capacitance sensor operable for detecting an electrically conductive object proximal to the fascia panel.

Another object of the present invention is to provide a vehicle lift gate assembly having a lift gate and a fascia panel thereon with the fascia panel having a capacitance sensor operable for detecting an electrically conductive object proximal to the fascia panel.

Another object of the present invention is to provide a vehicle lift gate assembly having a lift gate and a fascia panel thereon with the fascia panel having a capacitance sensor operable for detecting both an electrically conductive object proximal to the fascia panel and an electrically conductive or non-conductive object touching the fascia panel.

Another object of the present invention is to provide a vehicle door assembly having an interior door fascia with capacitance sensors in which each sensor may be respectively operable for detecting both an electrically conductive object proximal to that sensor and an electrically conductive or non-conductive object touching the fascia near that sensor.

Another object of the present invention is to provide a vehicle keyless entry assembly having a faceplate with capacitance sensors in which each sensor may be respectively operable for detecting both an electrically conductive object proximal to that sensor and an electrically conductive or non-conductive object touching the faceplate near that sensor.

In carrying out the above objects and other objects, the present invention provides a vehicle lift gate assembly having a movable lift gate within a metal construction. The assembly further includes an electrically non-conductive fascia panel mounted to the lift gate such that the fascia panel is spaced apart from lift gate. The fascia panel has an interior surface directed towards the lift gate and an exterior surface directed away from the lift gate. The assembly further includes an electrical conductor mounted to the fascia panel such that the conductor is spaced apart from the lift gate. The conductor capacitively couples to an electrically conductive object proximal to the exterior surface of the fascia panel while the conductor is driven with an electrical charge such that capacitance of the conductor changes due to the conductor capacitively coupling with the object.

Further, in carrying out the above objects and other objects, the present invention provides a vehicle door assembly. This assembly includes an interior door fascia having an electrically non-conductive faceplate. The faceplate has an interior surface and an exterior surface. This assembly further includes electrical conductors mounted to respective portions of the interior surface of the faceplate. The conductors are electrically isolated from one another. Each conductor capacitively couples to an electrically conductive object proximal to the exterior surface of the faceplate adjacent to the portion of the interior surface of the faceplate to which the conductor is mounted while the conductor is driven with an electrical charge such that capacitance of the conductor changes due to the conductor capacitively coupling with the object.

Also, in carrying out the above objects and other objects, the present invention provides a vehicle keyless entry assembly. This assembly includes an electrically non-conductive faceplate. The faceplate has an interior surface and an exterior surface. This assembly further includes an electrically non-conductive backing having electrically conductive traces which are electrically isolated from one another. The backing is mounted to the interior surface of the faceplate. This assembly further includes electrical conductors mounted to respective portions of the backing and electrically connected to respective traces of the backing. The conductors are electrically isolated from one another and each conductor is respectively associated with a vehicle keyless entry function. Each conductor capacitively couples to an electrically conductive object proximal to the exterior surface of the faceplate adjacent to the portion of the backing to which the conductor is mounted while the conductor is driven with an electrical charge such that capacitance of the conductor changes due to the conductor capacitively coupling with the object. This assembly further includes a controller electrically connected to the conductors via the respective traces for driving the conductors with the electrical charge and for measuring the capacitance of each conductor to determine whether an electrically conductive object is proximal to the exterior surface of the faceplate adjacent to the portion of the backing to which the conductor is mounted.

The above features, and other features and advantages of the present invention are readily apparent from the following detailed descriptions thereof when taken in connection with the accompanying drawings.

BRIEF DESCRIPTION OF THE DRAWINGS

FIG. 3A illustrates an interior view of the fascia panel and the sensor of the vehicle lift gate assembly shown in FIG. 2;

FIG. 3B illustrates an angled interior view of the fascia panel and the sensor of the vehicle lift gate assembly shown in FIG. 2;

FIG. 4A illustrates a perspective view of a vehicle lift gate assembly having a lift gate and a fascia panel thereon with the fascia panel having a capacitance sensor in accordance with an embodiment of the present invention;

FIG. 4B illustrates the cross-section "4B" of FIG. 4A where the sensor is configured for both electrically conductive and non-conductive object detection;

FIGS. 7A through 7D illustrate various views of a vehicle keyless entry assembly in accordance with an embodiment of the present invention.

DETAILED DESCRIPTION OF THE PREFERRED EMBODIMENT(S)

Figure 1A:
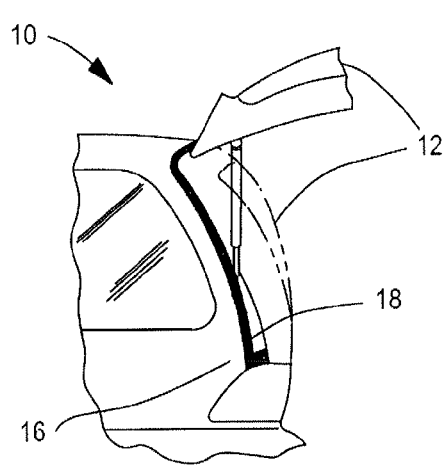
FIG. 1A illustrates a side view of a vehicle lift gate assembly having a lift gate according to the prior art.
Figure 1B:
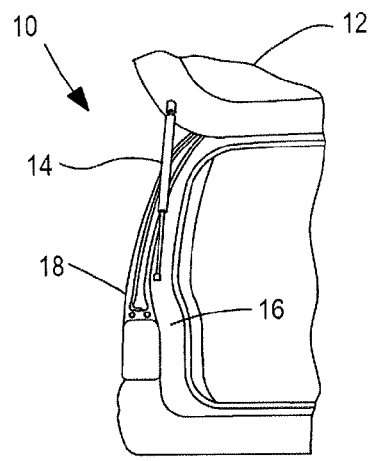
FIG. 1B illustrates a rear view of the vehicle lift gate assembly shown in FIG. 1A according to the prior art.

Referring now to FIGS. 1A and 1B, a vehicle lift gate assembly 10 according to the prior art having a lift gate 12 is shown. Lift gate 12 is connected by a cylinder 14 or the like to a body panel 16 of a vehicle. Cylinder 14 includes a piston rod which extends to move lift gate 12 to an opened position with respect to body panel 16 and contracts to move lift gate 12 to a closed position with respect to body panel 16 (lift gate 12 in the closed position is shown as a dotted line in FIG. 1A). A capacitance sensor 18 is mounted along body panel 16. Sensor 18 is operable for detecting the presence of an electrically conductive object such as a human body part extending into the opening between lift gate 12 and body panel 16 when the object is proximal to body panel 16.

Sensor 18 is part of an anti-entrapment system which includes a controller. Sensor 18 generally includes separated first and second electrically conductive conductors with a dielectric element therebetween. The conductors are set at different voltage potentials with respect to one another with one of the conductors typically being set at electrical ground. Sensor 18 has an associated capacitance which is a function of the different voltage potentials applied to the conductors. The capacitance of sensor 18 changes in response to the conductors being physically moved relative to one another such as when an object (either electrically conductive or non-conductive) touches sensor 18. Similarly, the capacitance of sensor 18 changes when an electrically conductive object comes into proximity with the conductor of sensor 18 that is not electrically grounded. As such, sensor 18 is operable to detect touching by an object on sensor 18 and/or the presence of an object near sensor 18 (i.e., an object in proximity to sensor 18).

The controller is in communication with sensor 18 to monitor the capacitance of sensor 18. When the capacitance of sensor 18 indicates that an object is near or touching sensor 18 (i.e., an object is near or touching vehicle body panel 16 to which sensor 18 is mounted), the controller controls lift gate 12 accordingly via cylinder 14. For instance, the controller controls lift gate 12 to halt movement in the closing direction when sensor 18 detects the presence of an object near sensor 18. In this case, the object may be a human such as a child and the controller halts the closing movement of lift gate 12 to prevent lift gate 12 from closing on the child. In this event, the controller may further control lift gate 12 to cause lift gate 12 to move in the opening direction in order to provide the child with room to move between the vehicle and lift gate 12 if needed. Instead of being mounted on body panel 16 as shown in FIGS. 1A and 1B, sensor 18 can be mounted on a closing member such as lift gate 12 or on any other closure opening where anti-trap is required.

Figure 2:
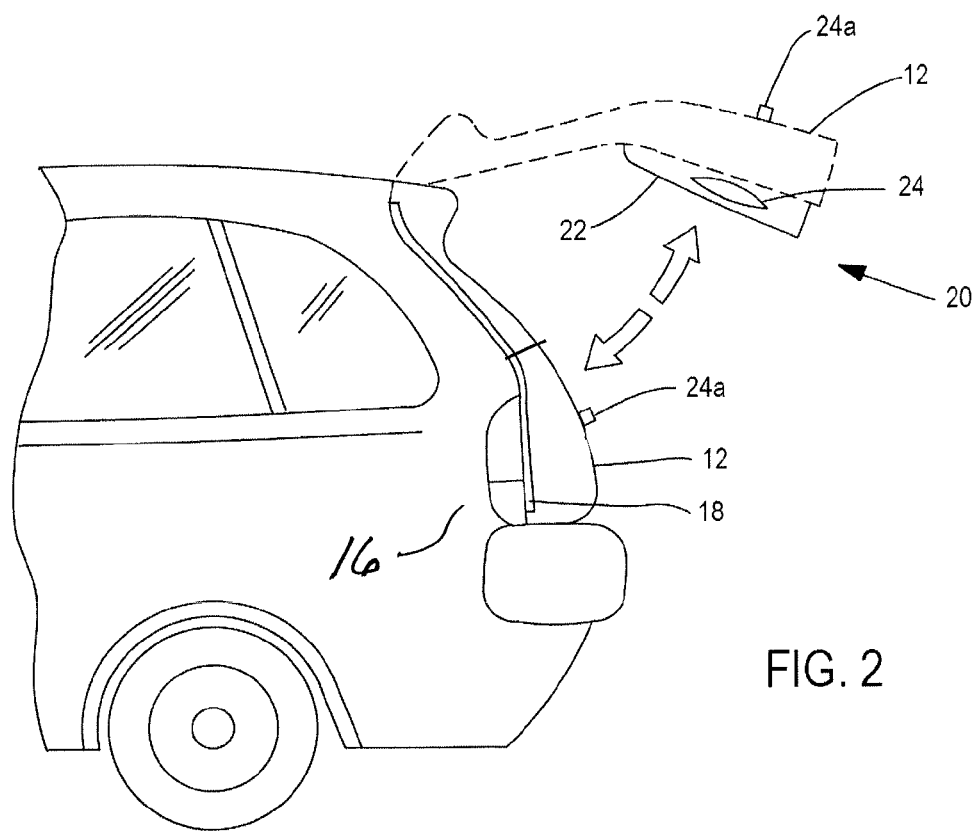
FIG. 2 illustrates a side view of a vehicle lift gate assembly having a lift gate and a fascia panel thereon with the fascia panel having a capacitance sensor in accordance with an embodiment of the present invention.

Referring now to FIG. 2, with continual reference to FIGS. 1A and 1B, a side view of a vehicle lift gate assembly 20 in accordance with an embodiment of the present invention is shown. Lift gate assembly 20 includes lift gate 12 which is movable between opened and closed positions with respect to vehicle body panel 16. Lift gate assembly 20 includes sensor 18 which is mounted along body panel 16 and is operable for detecting the presence of an electrically conductive object extending into the opening between lift gate 12 and body panel 16 when the object is touching or is proximal to sensor 18.

Lift gate assembly 20 differs from lift gate assembly 10 shown in FIGS. 1A and 1B in that lift gate 12 of lift gate assembly 20 includes an interior fascia panel 22 having a capacitance sensor 24. Fascia panel 22 is mounted to the interior surface of lift gate 12. Sensor 24 is mounted to the interior surface of fascia panel 22 which faces the vehicle interior when lift gate 12 is closed. As such, sensor 24 is between fascia panel 22 and lift gate 12. Alternatively, sensor 24 may be within fascia panel 22 or mounted to an exterior surface of fascia panel 22.

Like sensor 18, sensor 24 is part of an anti-entrapment system which includes a controller and is operable for detecting the presence of an electrically conductive object such as a human body part in proximity to sensor 24. Sensor 24 includes an electrically conductive conductor like the first conductor of sensor 18, but does not include another conductor like the second conductor of sensor 18. In general, the conductor of sensor 24 (i.e., sensor 24) capacitively couples to an electrically conductive object which is in either proximity to or is touching sensor 24 while sensor 24 is driven with an electrical charge. The controller is in communication with sensor 24 to monitor the capacitive coupling of sensor 24 to the object. The controller determines that an object is in proximity to or is touching sensor 24 (when sensor 24 is exposed to contact) upon detecting the capacitive coupling of sensor 24 to the object. In turn, the controller controls lift gate 12 accordingly.

As sensor 24 is mounted to fascia panel 22 which is mounted to lift gate 12, sensor 24 is operable for detecting the presence of an electrically conductive object extending into the opening between lift gate 12 and the vehicle body when the object is proximal to fascia panel 22 (as opposed to when the object is proximal to vehicle body panel 16 as provided by sensor 18). As such, sensor 24 expands the anti-entrapment capability compared to that of lift gate assembly 10 for detecting the presence of an object in the travel path of lift gate 12. An example is that sensor 24, which is located within fascia panel 22, can detect the presence of a person standing under an open lift gate 12 to thereby prevent fascia panel 22 (and thereby lift gate 12) from contacting the person as lift gate 12 is closing. To this end, when detection occurs, the controller halts downward travel and reverses movement of lift gate 12 back to the opened position. If desired, sensor 24 and the controller can be configured to monitor for a person in close proximity to lift gate 12 to prevent lift gate 12 from opening. For example, this detection prevents a person such as a child from accidentally falling out of the vehicle when lift gate 12 is partially opened. An alternative location for sensor 24 can be along each outer edge of lift gate opening.

Referring now to FIGS. 3A and 3B, with continual reference to FIG. 2, interior views of fascia panel 22 and sensor 24 of vehicle lift gate assembly 20 are shown. As indicated above, sensor 24 is placed on the interior surface of fascia panel 22 which faces the vehicle interior when lift gate 12 is closed. That is, sensor 24 is placed on the interior surface of fascia panel 22 which is farthest from lift gate 12. FIGS. 3A and 3B illustrate this interior surface of fascia panel 22.

As shown in FIGS. 3A and 3B, sensor 24 is formed from an array of electrically conductive strips which are placed vertically and horizontally across the interior surface of fascia panel 22. The strips of sensor 24 are in electrical connectivity to each other and together form the conductor of sensor 24 (i.e., the strips together are sensor 24). The strips of sensor 24 extend across this interior surface of fascia panel 22 following the contour of fascia panel 22. In this embodiment, fascia panel 22 is made of non-conductive plastic material which allows sensor 24 to detect the presence of conductive objects through fascia panel 22.

Sensor 24 can be placed on the external surface of fascia panel 22 which directly faces the vehicle interior when lift gate 12 is closed. However, placement of sensor 24 on the interior surface of fascia panel 24 hides sensor 24 from user view and protects sensor 24 against potential damage. Sensor 24 can also be over-molded on any surface of fascia panel 22 allowing for additional protection from damage caused by assembly or other handling.

The strips of sensor 24 can be configured into other array patterns utilizing angle or curvature combinations that may better optimize object detection objectives. Sensor 24 can be tailored and applied in any deliberate pattern to customize and enhance object detection performance. The distance between each strip is sufficient to provide continuous object detection coverage across the surface of fascia panel 22. Other configurations in place of the strips of sensor 24 include a solid sheet of electrically conductive material such as copper or aluminum foil, a conductive array or screen that is stamped, woven, or braided, multiple conductive decal-like shapes placed about the interior surface of fascia panel 22 and electrically interconnected, etc. The strips of sensor 24 are fabricated from copper, but may be fabricated from other materials including carbon inks, fabrics, plastics, elastomers, or other metals like aluminum, brass, bronze, and the like. There are various known methods to achieve electrical conductivity in fabrics, plastics and elastomers. The conductive material can be deposited onto the plastic or deposited into a carrier which is then inserted into the mold to form sensor 24.

As indicated above, the strips of sensor 24, which are electrically interconnected to one another, form a conductor which functions like a first conductive plate of a capacitor. Such a capacitor has a second conductive plate with the plates being separated from one another by a material such as a dielectric element. Unlike such a capacitor, sensor 24 is constructed without a second conductive plate nor without a second conductive plate electrically connected to ground. Instead, the metal construction of lift gate 12 functions as the second conductive plate and provides shielding of sensor 24 from stray capacitive influence.

Alternatively, sensor 24 can be constructed to use multiple layers of conductors, each separated by a non-conductive material. A ground layer of conductive material placed behind the other layers can be used to provide extra shielding as necessary.

Fascia panel 22 made of a rigid material restricts sensor 24 from detecting electrically non-conductive objects. This is because the rigidity of fascia panel 22 prevents fascia panel 22 from displacing when an object touches fascia panel 22. In turn, sensor 24 is prevented from displacing toward the metal construction of lift gate 12 when the object touches fascia panel 22. As such, any change of the capacitance between sensor 24 and lift gate 12 does not occur as a result of an electrically non-conductive object touching fascia panel 22. For both electrically conductive and non-conductive object modes of detection, sensor 24 may be mounted to the external surface of fascia panel 22. In this case, an object (electrically conductive or non-conductive) touching sensor 24 triggers sensor 24 (i.e., causes a change in capacitance between sensor 24 and the metal construction of lift gate 12) due to sensor 24 compressing (i.e., sensor 24 displacing towards lift gate 12). Likewise, sensor 24 mounted to the internal surface of fascia panel 22 can detect an object touching fascia panel 22 when fascia panel 22 is flexible and/or compressible to the degree required to allow sensor 24 to displace towards lift gate 12.

Referring now to FIGS. 4A and 4B, a vehicle lift gate assembly 40 in accordance with an embodiment of the present invention is shown. Lift gate assembly 40 is similar to lift gate assembly 20 in that lift gate assembly 40 includes a lift gate 12 and a fascia panel 22 thereon with fascia panel 22 having sensor 24. Lift gate assembly 40 is configured differently than lift gate assembly 20 in that a portion of fascia panel 22 of lift gate assembly 40 is configured to enable sensor 24 to perform both electrically conductive and non-conductive object detection near this portion of fascia panel 22. Sensor 24 as shown in FIG. 4B can be separate from the trim panel.

To this end, an element (e.g., a strip) of sensor 24 is positioned on the interior surface of an edge region of fascia panel 22 adjacently along an edge of lift gate 12 and is separated from lift gate 12 by a spacer 26. Spacer 26 is constructed of an electrically non-conductive material and is compressible. As described above, the metal construction of lift gate 12 provides the electrical ground used to shield sensor 24 from stray capacitive influence. This configuration is an example of extending fascia panel 22 to the extreme edges of lift gate 12 to sense the presence of an object in the travel path of lift gate 12 when lift gate 12 closes. Spacer 26 made of a compressible material such as open or closed cell foam rubber or other like materials allows the edge region of sensor 24 (and the edge region of fascia panel 22) to move spatially closer to the metal ground of lift gate 12 upon an object touching the edge region of fascia panel 22. Spacer 26 can be continuous or comprised of smaller sections arranged along the area to be sensed which allows movement of the edge regions of fascia panel 22 and sensor 24 when pressure is applied.

Sensor 24 can detect electrically conductive objects which are in proximity to or touching the edge region of sensor 24 and can detect electrically non-conductive objects which are touching the edge region of sensor 24. In particular, sensor 24 can detect an electrically conductive object proximal to the edge region of sensor 24 due to the capacitive coupling of the edge region of sensor 24 with the object. Sensor 24 can detect an object (electrically conductive or non-conductive) touching the edge region of fascia panel due to the capacitance of sensor 24 with the metal construction of lift gate 12 changing as a result of the edge region of sensor 24 being displaced from the touch in the direction of lift gate 12. Spacer 26 compresses to allow the edge region of sensor 24 to displace towards lift gate 12.

Applications of sensor 24 are not limited to fascia panel 22 of lift gate assemblies 20, 40. Likewise, in addition to detecting the presence of an object for anti-entrapment purposes, sensor 24 can be positioned behind any electrically non-conductive surface and be configured to detect the presence, position, or motion of an electrically conductive object such as a human. Sensor 24 and its controller can serve as an interface between a human user and a vehicle to enable the user to control various vehicle functions requiring human input. The controller can be configured to have sensitivity to detect the position of a person's finger in proximity to sensor 24 prior to carrying out an actual key press or other type of user activation. For example, it may be desired to initiate a sequence of operations by positioning a finger or hand in proximity to a series of sensors 24 ("touch pads") followed by a specific activation command once a sought out function has been located. The initial finger positioning can be to illuminate keypads or the like associated with the series of sensors 24 to a first intensity without activation of a command. As the touch area expands from increased finger pressure, the signal increases thereby allowing the controller to distinguish between positioning and activation command functions. Confirmation of the selection, other than activation of the desired function, can be configured to increased illumination intensity, audible feedback, or tactile feedback such as vibration. Each sensor 24 ("touch area") can have a different audio and feel to differentiate the touch area operation.

Figure 5:
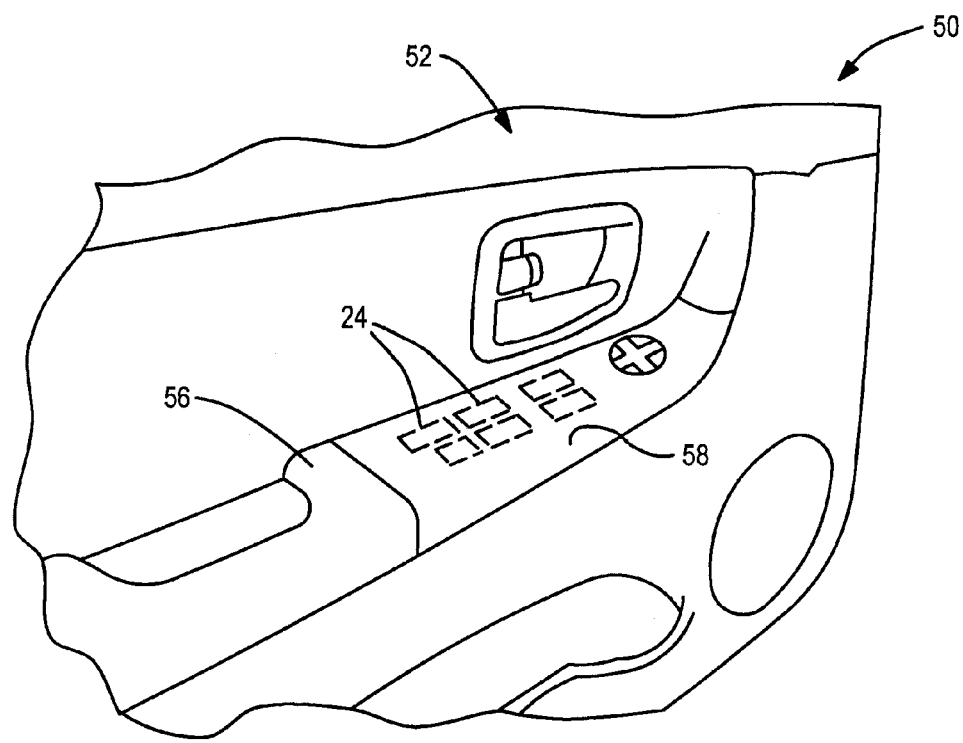
FIG. 5 illustrates a perspective view of a vehicle door assembly having an interior door fascia and capacitance sensors in accordance with an embodiment of the present invention.
Figure 6:
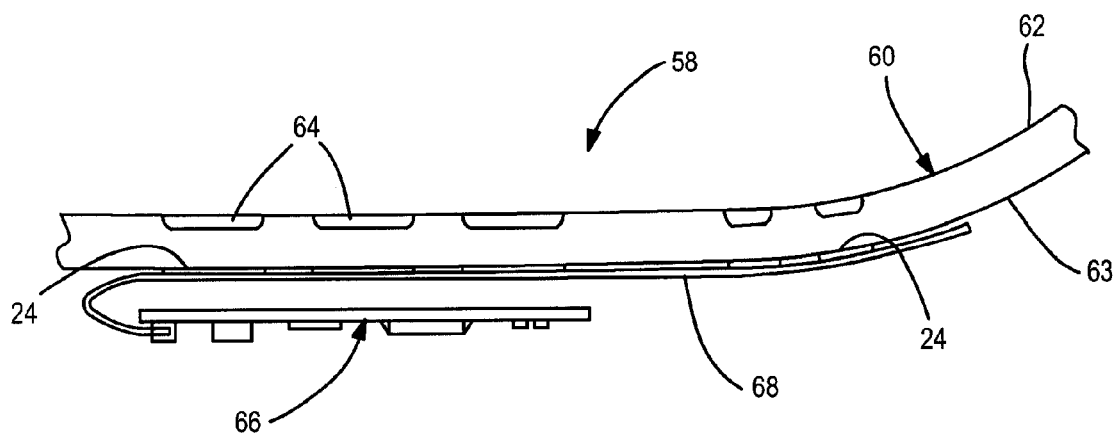
FIG. 6 illustrates a cross-sectional view of the arrangement of the sensors of the vehicle door assembly shown in FIG. 5.

Referring now to FIGS. 5 and 6, a vehicle door assembly 50 in accordance with an embodiment of the present invention will be described. Vehicle door assembly 50 represents an application of sensor 24 to an environment other than vehicle lift gate assemblies. Assembly 50 includes an interior door fascia 52 and a series of sensors 24. FIG. 5 illustrates a perspective view of vehicle door assembly 50 and FIG. 6 illustrates a cross-sectional view of the arrangement of sensors 24.

Sensors 24 of vehicle door assembly 50 are each formed by their own conductor and are not directly electrically connected to one another. As such, each sensor 24 defines a unique touch pad associated with a unique touch area in which object detection of one sensor 24 does not depend on object detection of another sensor 24. Sensors 24 are arranged into an array and function independently of one another like an array of mechanical switches that commonly control vehicle functions like window up and down travel, door locking and unlocking, positioning of side view mirrors, etc.

Interior door fascia 52 includes a pull handle 56 and a faceplate assembly 58 which together create an armrest component of door fascia 52. Sensors 24 are individually attached to the underside of faceplate assembly 58. Each sensor 24 has a sufficient area to detect a human finger proximal to that sensor. Object detection by a sensor 24 occurs when a portion of a user's body such as a hand or finger comes within sensitivity range directly over that sensor 24. By locating multiple sensors 24 on the underside of faceplate assembly 58, a sensor array is created to resemble the array of mechanical switches. Sensors 24 can be configured to have many different kinds of shapes such as raised surfaces or recessed contours to prevent accidental activation. Adding faceplate assembly 58 to the reversing control of a power window reduces complexity and cost associated with mechanical switches and associated wiring. The power window control for up/down can be incorporated into faceplate assembly 58 or the control can be remote if required due to vehicle design and packaging.

Referring briefly back to FIG. 2, a second sensor 24*a* placed on the external surface of the hatch (i.e., lift gate 12) of the vehicle can be used as an interface to operate the hatch. Additionally, a single controller can be used to interface with both anti-entrapment sensor 24 and hatch operating sensor 24*a*.

Referring back to FIGS. 5 and 6, faceplate assembly 58 includes a faceplate 60 made of electrically non-conductive material. Faceplate 60 provides support for multiple sensors 24 mounted to its underside (i.e., underside faceplate surface 63) and allows for object detection through its topside (i.e., topside faceplate surface 62). Underside faceplate surface 63 is relatively smooth to permit close mounting of sensors 24 to faceplate 60. However, degrees of roughness can also be configured to function effectively. Topside faceplate surface 62 can have any number of physical features 64 or graphical markings which are respectively associated (e.g., aligned) with sensors 24 in order to assist a user in locating the position of each sensor 24 and identifying the function assigned therewith.

Each sensor 24 is formed as a thin electrically conductive pad mounted firmly to underside faceplate surface 63. Each sensor 24 in this configuration is pliable and can therefore be formed to the contours of the surface of faceplate 60 to which the sensor is attached. An adhesive may be applied between sensors 24 and the surface of faceplate 60 for positioning and support as well as minimizing air gaps between sensors 24 and the faceplate surface. Alternatively, sensors 24 can be molded into faceplate 60 thereby eliminating the need for adhesive or other mechanical attachment. Another alternate is each sensor 24 being arranged as a member mounted directly on a printed circuit board (PCB) 66 (i.e., a controller) and extending up toward, and possibly contacting, underside faceplate surface 63. With this arrangement, sensors 24 can be in direct physical and electrical contact with PCB 66 or in indirect contact with PCB 66 through the use of a joining conductor.

Each sensor 24 can be constructed of an electrically conductive material such as a conductive foam, a metal, a conductive plastic, or a non-conductive element with a conductive coating applied thereon. Materials used to construct sensors 24 should be of a compressible nature to account for tolerance stack-ups that are a normal part of any assembly having more than one component. Sensor compressibility ensures that contact is maintained between faceplate 60 and PCB 66. In the event that faceplate 60 is to be backlit, the use of a light pipe with conductive coating applied could be configured as a sensor 24.

Sensors 24 can be constructed from materials having low electrical resistance such as common metals like copper or aluminum. Other materials exhibiting low electrical resistance such as conductive plastics, epoxies, paints, inks, or metallic coatings can be used. Sensors 24 can be preformed to resemble decals, stickers, or tags. Sensors 24 can be applied onto surfaces as coatings or etched from plated surfaces. If materials are delicate, then a non-conductive backing 68 such as polyester film, fiberglass, paper, rubber, or the like can support and protect sensors 24 during installation. In applications where multiple sensing areas are required, backing 68 can assist in locating and anchoring sensors 24 to faceplate 60.

With reference to FIG. 6, backing 68 is a flexible circuit having copper pads which make up the touch pads of sensors 24 (i.e., each sensor 24 includes a copper pad). Backing 68 includes separated copper wires electrically connected to respective sensors 24 (shown in FIG. 7B). Backing 68 makes an electrical connection to PCB 66 such that each sensor 24 is electrically connected to the signal conditioning electronics of PCB 66. In an alternate configuration, backing 68 and PCB 66 are combined into a single circuit board containing both the touch pads of sensors 24 and the signal conditioning electronics.

In order to activate a sensor 24, a user applies a finger to the associated marking 64 on the surface of faceplate 60. Electronic signal conditioning circuitry of PCB 66 which is interfaced to sensor 24 then processes the input signal from sensor 24 and completes circuit connections to activate the commanded function. The action is similar to pressing a mechanical switch to complete an electrical circuit.

Placement of sensors 24 behind a non-conductive barrier such as faceplate 60 creates a protective barrier between users and sensors 24 and shields sensors 24 against environmental contaminants. Sensors 24 can be applied to the backside of virtually any non-conductive barrier and preferably are flexible enough to conform to complex geometries where operator switch functions are needed. Sensors 24 can be contoured and configured from more rigid materials if desired. Examples of switch locations in a vehicle are door panels, armrests, dashboards, center consoles, overhead consoles, internal trim panels, exterior door components, and the like. Sensors 24 can be arranged individually or grouped as keypad arrays. Sensors 24 can be arranged into patterns of sequential sensing elements which are either electrically discrete or interconnected to create ergonomically appealing interfaces.

Referring now to FIGS. 7A through 7D, with continual reference to FIGS. 5 and 6, various views of a vehicle keyless entry assembly 70 in accordance with an embodiment of the present invention are shown. Vehicle keyless entry assembly 70 represents an example of an automotive application incorporating sensors 24. Sensors 24 of vehicle keyless entry assembly 70 function as touch pads to activate a vehicle keyless entry. In addition to sensors 24, vehicle keyless entry assembly 70 includes a faceplate 60, a backing 68, and a PCB 66 (i.e., a controller). Sensors 24 with backing 68 are configured as a flexible circuit which uses individual conductive coatings for the touch pads of sensors 24. Backing 68 makes respective electrical connections between sensors 24 and the signal conditioning electronics on PCB 66.

Vehicle keyless entry assembly 70 represents an example of a product requiring backlighting. As such, sensors 24 have to be capable of passing light. Accordingly, faceplate 60 in this configuration is a molded transparent or translucent non-conductive material such as GE Plastics Lexan® 141 grade polycarbonate. Other resins or materials meeting the application requirements including acceptable light transmittance characteristics can also be used for faceplate 60. Sensors 24 are attached to the underside 68a of backing 68. In turn, the topside 68b of backing 68 is attached to the interior surface of faceplate 60 using adhesive 72. The topside 68b of backing 68 has graphic characters 64 that locate the position of associated sensors 24 and identify the function assigned therewith. Either the underside 68a or the topside 68b of backing 68 has individual traces 74 for making an electrical connection between sensors 24 and PCB 66. Connection between backing 68 and PCB 66 is connected by a flat cable 76 which contains traces 74. This interconnect can be accomplished using other carriers such as individual wires, header style connectors, and the like. In any of the configurations, sensors 24 can be applied directly to the surface which is to be touched for activation. However, sensors 24 are on the backside of the touch surface for protection and wear resistance.

Each sensor 24 of vehicle keyless entry assembly 70 may be made from Indium Tin Oxide (ITO) which is optically transparent and electrically conductive with an electrical resistance measuring sixty ohms/sq. Other electrically conductive materials such as foam, elastomer, plastic, or a nonconductive structure with a conductive coating applied thereon can be used to produce a sensor 24 having transparent or translucent properties and being electrically conductive. Conductive materials that are opaque such as metal, plastic, foam, elastomer, carbon inks, or other coatings can be hollowed to pass light where desired while the remaining perimeter of material acts as sensor 24.

An optically transparent and an electrically conductive sensor 24 made from ITO may create a color shift as light travels through the sensor and through the faceplate to which the sensor is attached. This color shift is a result of the optical quality and reflection of the optical distance between the front ITO surface of the sensor and the rear ITO surface of the sensor. In order to eliminate the light transmission errors between the different ITO layers, a transparent coating is applied on the rear ITO surface to initially bend the light which thereby eliminates the color differential seen on the front surface of the sensor between the front and rear ITO surfaces of the sensor. Additionally, an acrylic coating may be applied on the sensor to provide a layer of protection and durability for exposed ITO.

While embodiments of the present invention have been illustrated and described, it is not intended that these embodiments illustrate and describe all possible forms of the present invention. Rather, the words used in the specification are words of description rather than limitation, and it is understood that various changes may be made without departing from the spirit and scope of the present invention.

What is claimed is:

1. A vehicle lift gate assembly comprising:
   a movable lift gate having a metal construction;
   an electrically non-conductive fascia panel mounted to the lift gate, the fascia panel having a perimeter, a central section, an interior surface directed towards the lift gate, and an exterior surface directed away from the lift gate;
   an electrical conductor being an array of electrically conductive strips placed vertically and horizontally across the central section of the fascia panel in electrical connectivity to each other and mounted to the interior surface of the fascia panel such that the electrical conductor is spaced apart from the metal of the lift gate, the electrical conductor functioning as one portion of a capacitor and the metal of the lift gate functioning as another portion of the capacitor;
   a controller in communication with the electrical conductor for driving the electrical conductor with an electrical charge to monitor a capacitive coupling of the electrical conductor and for measuring a capacitance of the capacitive coupling to determine whether an electrically conductive object is proximal to the fascia panel and operable to control movement of the lift gate as a function of whether the electrically conductive object is proximal to the fascia panel; and
   wherein the electrical conductor capacitively couples to the electrically conductive object proximal to the exterior surface of the fascia panel while the electrical conductor is driven with the electrical charge such that a capacitance indicated by the electrical conductor changes due to the electrical conductor capacitively coupling with the electrically conductive object.

2. The assembly of claim 1 wherein:
   the fascia panel is rigid such that the fascia panel maintains the spaced apart relationship with the lift gate upon an object touching the exterior surface of the fascia panel in a direction toward the lift gate; and
   the capacitance remains constant in response to an electrically non-conductive object touching the exterior surface of the fascia panel.

3. The assembly of claim 1 wherein:
   the conductor is mounted within the fascia panel to the fascia panel.

4. The assembly of claim 1 wherein the electrical conductor is a first electrical conductor, the assembly further comprising:

a second electrical conductor mounted to the fascia panel such that the second conductor is spaced apart from the lift gate and is spaced apart from the first conductor, wherein the first and second conductors are electrically connected to one another, wherein at least one of the conductors capacitively couples to an electrically conductive object proximal to the exterior surface of the fascia panel while the conductors are driven with an electrical charge such that capacitance of the conductors changes due to the at least one of the conductors capacitively coupling with the electrically conductive object.

5. The assembly of claim 1 comprising:

an electrically non-conductive compressible spacer between a portion of the lift gate and a portion of the fascia panel, wherein a portion of the conductor is mounted to the portion of the fascia panel;

wherein the spacer compresses toward the lift gate in response to an object touching the exterior surface of the portion of the fascia panel such that the portion of the conductor displaces toward the lift gate, wherein the capacitance changes due to the portion of the conductor being displaced toward the lift gate upon an object touching the exterior surface of the portion of the fascia panel.

6. The assembly of claim 1 wherein the electrical conductor is a first electrical conductor, the assembly further comprising:

a second electrical conductor mounted to the lift gate, wherein the second conductor capacitively couples to an electrically conductive object touching the second conductor while the second conductor is driven with an electrical charge such that capacitance of the second conductor changes due to the second conductor capacitively coupling with the electrically conductive object;

wherein the controller drives the second conductor with the electrical charge and measures the capacitance of the second conductor to determine whether an electrically conductive object is touching the second conductor, wherein the controller is operable with the lift gate to control movement of the lift gate as a function of whether an electrically conductive object is touching the second conductor.

7. The assembly of claim 1, wherein the fascia panel and the electrical conductor are flexible such that the fascia panel and the electrical conductor are displaceable toward the metal of the lift gate upon an object touching the exterior surface of the fascia panel in a manner that urges the fascia panel and the electrical conductor toward the metal of the lift gate; and the capacitance is dependent upon an amount of spacing between the electrical conductor and the metal of the lift gate such that movement of the electrical conductor toward the metal of the lift gate changes the capacitance.

8. A vehicle lift gate assembly comprising:

a movable lift gate having a metal construction;

an electrically non-conductive fascia panel mounted to the lift gate, the fascia panel having a perimeter, a central section, an interior surface directed towards the lift gate, and an exterior surface directed away from the lift gate; and an electrical conductor being an array of electrically conductive strips placed vertically and horizontally across the central section of the fascia panel in electrical connectivity to each other and mounted to the fascia panel such that the electrical conductor is spaced apart from the metal of the lift gate, the electrical conductor functioning as one portion of a capacitor and the metal of the lift gate functioning as another portion of the capacitor, wherein the electrical conductor capacitively couples to an electrically conductive object proximal to the exterior surface of the fascia panel while the electrical conductor is driven with an electrical charge such that a capacitance indicated by the electrical conductor changes due to the electrical conductor capacitively coupling with the electrically conductive object;

wherein the electrical conductor is mounted to the exterior surface of the fascia panel.

9. The assembly of claim 8 comprising:

a controller for driving the electrical conductor with the electrical charge and for measuring the capacitance to determine that an electrically conductive object is proximal to the exterior surface of the fascia panel or an object is touching the exterior surface of the fascia panel;

wherein the controller is operable to control movement of the lift gate as a function of either an electrically conductive object being proximal to the exterior surface of the fascia panel or an object touching the exterior surface of the fascia panel.

10. The assembly of claim 8 wherein:

the facial panel is rigid such that the fascia panel maintains the spaced apart relationship with the lift gate upon an object touching the exterior surface of the fascia panel in a direction toward the lift gate; and the capacitance remains constant in response to an electrically non-conductive object touching the exterior surface of the fascia panel.

11. The assembly of claim 8 wherein the electrical conductor is a first electrical conductor, the assembly further comprising:

a second electrical conductor mounted to the fascia panel such that the second conductor is spaced apart from the lift gate and is spaced apart from the first conductor, wherein the first and second conductors are electrically connected to one another, wherein at least one of the conductors capacitively couples to an electrically conductive object proximal to the exterior surface of the fascia panel while the conductors are driven with an electrical charge such that capacitance of the conductors changes due to the at least one of the conductors capacitively coupling with the electrically conductive object.

12. A vehicle lift gate assembly comprising:

a movable lift gate having a metal construction;

an electrically non-conductive fascia panel mounted to the lift gate, the fascia panel having a perimeter, a central section, an interior surface directed towards the lift gate, and an exterior surface directed away from the lift gate;

an electrical conductor being an array of electrically conductive strips placed vertically and horizontally across the central section of the fascia panel in electrical connectivity to each other and mounted interior to the interior surface and exterior surface of the fascia panel such that the electrical conductor is spaced apart from the metal of the lift gate, the electrical conductor functioning as one portion of a capacitor and the metal of the lift gate functioning as another portion of the capacitor; and wherein the electrical conductor capacitively couples to an electrically conductive object proximal to the exterior surface of the fascia panel while the electrical conductor is driven with the electrical charge such that a capacitance indicated by the electrical conductor changes due to the electrical conductor capacitively coupling with the electrically conductive object.

13. The assembly of claim 12 comprising:
an electrically non-conductive compressible spacer between a portion of the lift gate and a portion of the fascia panel, wherein a portion of the electrical conductor is mounted to the portion of the fascia panel;
wherein the spacer compresses toward the lift gate in response to an object touching the exterior surface of the portion of the fascia panel such that the portion of the electrical conductor displaces toward the lift gate, wherein the capacitance changes due to the portion of the electrical conductor being displaced toward the lift gate upon an object touching the exterior surface of the portion of the fascia panel.

14. An assembly as set forth in claim 12 including a controller for driving the electrical conductor with the electrical charge and for measuring the capacitance to determine that an electrically conductive object is proximal to the exterior surface of the fascia panel or an object is touching the exterior surface of the fascia panel, wherein the controller is operable to control movement of the lift gate as a function of either an electrically conductive object being proximal to the exterior surface of the fascia panel or an object touching the exterior surface of the fascia panel.

* * * * *